United States Patent
Lee et al.

(10) Patent No.: US 9,214,559 B2
(45) Date of Patent: Dec. 15, 2015

(54) GRAPHENE-TRANSFERRING MEMBER, GRAPHENE TRANSFERRER, METHOD OF TRANSFERRING GRAPHENE, AND METHODS OF FABRICATING GRAPHENE DEVICE BY USING THE SAME

(71) Applicant: Samsung Electronics Co., Ltd., Suwon-Si, Gyeonggi-Do (KR)

(72) Inventors: Joo-ho Lee, Hwaseong-si (KR); Chang-seung Lee, Yongin-si (KR); Yong-sung Kim, Namyangju-si (KR); Hyun-jae Song, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 485 days.

(21) Appl. No.: 13/659,131

(22) Filed: Oct. 24, 2012

(65) Prior Publication Data

US 2013/0098540 A1    Apr. 25, 2013

(30) Foreign Application Priority Data

Oct. 24, 2011  (KR) .................. 10-2011-0108807

(51) Int. Cl.

| | |
|---|---|
| *B29C 65/52* | (2006.01) |
| *B29C 65/54* | (2006.01) |
| *B32B 37/26* | (2006.01) |
| *B32B 38/10* | (2006.01) |
| *H01L 29/786* | (2006.01) |
| *H01L 29/423* | (2006.01) |
| *H01L 29/66* | (2006.01) |

(Continued)

(52) U.S. Cl.
CPC .... *H01L 29/78603* (2013.01); *H01L 29/42384* (2013.01); *H01L 29/66742* (2013.01); *H01L 29/78684* (2013.01); *H01L 29/1606* (2013.01); *H01L 29/7781* (2013.01); *Y10T 428/24917* (2015.01)

(58) Field of Classification Search
USPC .................. 156/230, 233–237, 241, 247, 249
See application file for complete search history.

(56) References Cited

U.S. PATENT DOCUMENTS 8,268,180 B2 *  9/2012  Arnold et al. ................... 216/56
8,497,499 B2 *  7/2013  Davidovic et al. .............. 257/40

(Continued)

FOREIGN PATENT DOCUMENTS

| KR | 20090129176 A | 12/2009 |
|---|---|---|
| KR | 2010-0046633 A | 5/2010 |

(Continued)

OTHER PUBLICATIONS

English Abstract of KR 10-2011-0031864 (Feb. 16, 2012).*

(Continued)

*Primary Examiner* — Sing P Chan
(74) *Attorney, Agent, or Firm* — Harness, Dickey & Pierce, P.L.C.

(57) ABSTRACT

Graphene transferring members, graphene transferrer, methods of transferring graphene, and methods of fabricating a graphene device, may include a metal thin-film layer pattern and a graphene layer sequentially stacked on an adhesive member. The metal thin-film layer and the graphene layer may have the same shape. After transferring the graphene layer onto a transfer-target substrate during the fabrication of a graphene device, the metal thin-film layer is patterned to form electrodes on respective ends of the graphene layer by removing a portion of the metal thin-film layer.

16 Claims, 6 Drawing Sheets

(51) Int. Cl.
*H01L 29/778* (2006.01)
*H01L 29/16* (2006.01)

(56) References Cited

U.S. PATENT DOCUMENTS

| | | | | |
|---|---|---|---|---|
| 8,575,665 | B2* | 11/2013 | Heo et al. | 257/288 |
| 8,709,881 | B2* | 4/2014 | Zhang et al. | 438/142 |
| 8,822,308 | B2* | 9/2014 | Willner | 438/455 |
| 8,828,523 | B2* | 9/2014 | Moon et al. | 428/195.1 |
| 8,932,673 | B2* | 1/2015 | Patil | 427/249.1 |
| 8,980,217 | B2* | 3/2015 | Hiura et al. | 423/448 |
| 8,999,812 | B2* | 4/2015 | Xianyu et al. | 438/455 |
| 9,056,424 | B2* | 6/2015 | Wenxu et al. | 1/1 |
| 2008/0149322 | A1* | 6/2008 | Ottinger et al. | 165/185 |
| 2010/0021708 | A1* | 1/2010 | Kong et al. | 428/220 |
| 2010/0143726 | A1 | 6/2010 | Golzhauser et al. | |
| 2010/0224851 | A1 | 9/2010 | Colombo et al. | |
| 2011/0030772 | A1 | 2/2011 | Veerasamy | |
| 2011/0030879 | A1 | 2/2011 | Veerasamy | |
| 2011/0033688 | A1 | 2/2011 | Veerasamy | |
| 2011/0108521 | A1* | 5/2011 | Woo et al. | 216/36 |
| 2011/0108806 | A1* | 5/2011 | Davidovic et al. | 257/29 |
| 2011/0195207 | A1* | 8/2011 | Hong et al. | 428/34.1 |
| 2011/0201201 | A1* | 8/2011 | Arnold et al. | 438/694 |
| 2011/0269299 | A1* | 11/2011 | Zhang et al. | 438/478 |
| 2012/0141799 | A1* | 6/2012 | Kub et al. | 428/408 |
| 2012/0241069 | A1* | 9/2012 | Hofmann et al. | 156/60 |
| 2012/0256167 | A1* | 10/2012 | Heo et al. | 257/27 |
| 2013/0149463 | A1* | 6/2013 | Zhang et al. | 427/552 |
| 2013/0187097 | A1* | 7/2013 | Hong et al. | 252/510 |
| 2013/0189444 | A1* | 7/2013 | Kub et al. | 427/523 |
| 2013/0266739 | A1* | 10/2013 | Lin et al. | 427/535 |
| 2013/0287956 | A1* | 10/2013 | Patil | 427/333 |
| 2013/0309458 | A1* | 11/2013 | Moon et al. | 428/195.1 |
| 2014/0034899 | A1* | 2/2014 | Ahn et al. | 257/9 |
| 2014/0162433 | A1* | 6/2014 | Willner | 438/458 |
| 2014/0178598 | A1* | 6/2014 | Chung et al. | 427/535 |
| 2014/0205763 | A1* | 7/2014 | Lu et al. | 427/530 |
| 2014/0212659 | A1* | 7/2014 | Dai et al. | 428/336 |
| 2014/0255500 | A1* | 9/2014 | Son et al. | 424/490 |
| 2014/0261998 | A1* | 9/2014 | Veerasamy | 156/247 |
| 2014/0299475 | A1* | 10/2014 | Bullington et al. | 205/50 |
| 2014/0306184 | A1* | 10/2014 | Ruhl et al. | 257/29 |
| 2014/0308523 | A1* | 10/2014 | Veerasamy et al. | 428/408 |
| 2014/0314624 | A1* | 10/2014 | Dooley et al. | 422/82.02 |
| 2014/0374960 | A1* | 12/2014 | Cojocaru | 264/430 |
| 2015/0010701 | A1* | 1/2015 | Hong et al. | 427/178 |
| 2015/0083224 | A1* | 3/2015 | Fogel et al. | 136/263 |
| 2015/0084004 | A1* | 3/2015 | Fogel et al. | 257/40 |
| 2015/0093324 | A1* | 4/2015 | Thevasaharam | 423/448 |

FOREIGN PATENT DOCUMENTS

| | | | |
|---|---|---|---|
| KR | 2011-0001621 A | 1/2011 | |
| KR | 1020110031864 A * | 3/2011 | C01B 31/02 |
| KR | 20110042023 A | 4/2011 | |
| KR | 2011-0052300 A | 5/2011 | |
| KR | 2011-0061908 A | 6/2011 | |
| WO | WO 2010065518 A1 * | 6/2010 | G11C 11/18 |

OTHER PUBLICATIONS

Machine Translation of KR 10-2011-0031864 (Jun. 24, 2015).*

* cited by examiner

GRAPHENE-TRANSFERRING MEMBER, GRAPHENE TRANSFERRER, METHOD OF TRANSFERRING GRAPHENE, AND METHODS OF FABRICATING GRAPHENE DEVICE BY USING THE SAME

CROSS-REFERENCE TO RELATED APPLICATIONS

This application claims the benefit of Korean Patent Application No. 10-2011-0108807, filed on Oct. 24, 2011, in the Korean Intellectual Property Office, the disclosure of which is incorporated herein by reference in its entirety.

BACKGROUND

1. Field

Example embodiments relate to a graphene-transferring member in which metal thin films are formed on graphene, a graphene transferrer, a method of transferring graphene, and/or methods of fabricating graphene devices by using the same.

2. Description of the Related Art

Graphene, which has a 2-dimensional hexagonal carbon structure, is a new material that may replace other semiconductors. Graphene is a zero gap semiconductor. Also, graphene has a carrier mobility of 100,000 $cm^2V^{-1}s^{-1}$ at room temperature, which is approximately 100 times higher than that of silicon. Thus, graphene may be applied to high-frequency devices (e.g., radio frequency (RF) devices).

When a graphene nano-ribbon (GNR) having a graphene channel width of 10 nm or less is formed, a band gap is formed in the GNR by a size effect. Accordingly, a field effect transistor operable at room temperature may be manufactured using the GNR.

A graphene device is an electronic device that uses graphene and may be, for example, a field effect transistor, an RF transistor, or a sensor.

Graphene may be formed by growing on a metal thin film (e.g., copper (Cu) or nickel (Ni)) by using a chemical vapor deposition (CVD) method, or by thermally decomposing a SiC substrate. In order to apply the graphene to semiconductor devices, the graphene must be grown on an insulating film. However, the growing of high quality graphene on the insulating film is very difficult.

Accordingly, methods of transferring already grown graphene on an insulating film using a thermal exfoliating tape, or poly methyl methacrylate (PMMA). have been introduced. However, when these transferring methods are used, defects (e.g., tearing or wrinkling) may occur when the thermal exfoliating tape or PMMA attached to the graphene is removed (or, separated) from the graphene.

Also, in a process of patterning graphene, some portions of a photoresist may remain on the graphene in a process of removing the used photoresist.

SUMMARY

Example embodiments relate to a graphene-transferring member in which metal thin films are formed on graphene, a graphene transferrer, a method of transferring graphene, and/or methods of fabricating graphene devices by using the same.

In an example embodiment, provided is a graphene-transferring member including a metal thin film layer on the graphene that may protect graphene in graphene transferring processes and fabricating graphene devices.

In another example embodiment, provided is a method of fabricating a graphene transferring member.

In a further example embodiment, provided are also methods of fabricating graphene devices by using a graphene-transferring member.

Additional aspects will be set forth in part in the description which follows and, in part, will be apparent from the description, or may be learned by practice of the presented example embodiments.

According to an example embodiment, there is provided a graphene transferring member that includes an adhesive member, a metal thin-film layer pattern and a graphene layer sequentially stacked on an adhesive member, wherein the metal thin-film layer pattern and the graphene layer have a same shape.

The adhesive member may be one selected from an adhesive tape, glue, polycarbonate, an epoxy resin, a thermal release tape, a water-soluble tape, and a photoresist.

The metal thin-film layer pattern may be formed of a metal selected from gold (Au), copper (Cu), nickel (Ni), titanium (Ti), iron (Fe), ruthenium (Ru), palladium (Pd) and a combination thereof.

The graphene layer may be a single layer graphene or a bi-layer graphene.

According to another example embodiment, there is provided a method of transferring graphene including sequentially forming a sacrificial layer and a catalyst layer on a substrate; growing a graphene layer on the catalyst layer; forming a metal thin-film layer on the graphene layer; patterning the metal thin-film layer, the graphene layer, and the catalyst layer to form the metal thin-film layer pattern, the graphene layer pattern and a catalyst layer pattern; forming an adhesive layer on the metal thin-film layer pattern; sequentially removing the sacrificial layer and the catalyst layer pattern; and transferring the graphene layer pattern and the metal thin-film layer pattern from the adhesive layer onto a transfer-target substrate so that the graphene layer pattern contacts the transfer-target substrate.

The adhesive layer may be one selected from an adhesive tape, glue, polycarbonate, an epoxy resin, a thermal release tape, a water-soluble tape, and a photoresist.

The graphene layer may be a single layer graphene or a bi-layer graphene.

The metal thin-film layer and the graphene layer may be patterned into a same shape.

The catalyst layer may be formed of a metal selected from nickel (Ni), iron (Fe), cobalt (Co), copper (Cu), platinum (Pt), ruthenium (Ru) and a combination thereof.

The metal thin-film layer may be formed of a metal selected from Au, Cu, Ni, Ti, Fe, Ru, Pd and a combination thereof.

The removing the catalyst layer pattern may include using a galvanic corrosion effect.

According to a further example embodiment, there is provided a method of fabricating a graphene device including sequentially forming a sacrificial layer and a catalyst layer on a substrate; growing a graphene layer on the catalyst layer; forming a metal thin-film layer on the graphene layer; patterning the metal thin-film layer, the graphene layer, and the catalyst layer to form the metal thin-film layer pattern, a graphene layer pattern and a catalyst layer pattern; forming an adhesive layer on the metal thin-film layer pattern; sequentially removing the sacrificial layer and the catalyst layer pattern; transferring the graphene layer pattern and the metal thin-film pattern from the adhesive layer onto a transfer-target substrate so that the graphene layer pattern contacts the transfer-target substrate; removing the adhesive layer; and patterning the metal thin-film layer pattern to form electrodes at respective ends of the graphene layer pattern. A portion of the graphene layer pattern between the electrodes is exposed.

The adhesive layer may be one selected from an adhesive tape, glue, polycarbonate, an epoxy resin, a thermal release tape, a water-soluble tape, and a photoresist.

The graphene layer may be a single layer graphene or a bi-layer graphene.

The metal thin-film layer pattern and the graphene layer pattern may have a same shape.

The catalyst layer may be formed of a metal selected from Ni, Fe, Co, Cu, Pt, Ru and a combination thereof.

The metal thin-film layer may be formed of a metal selected from Au, Cu, Ni, Ti, Fe, Ru, Pd and a combination thereof.

The removing the catalyst layer may include using a galvanic corrosion effect.

The portion of the graphene layer pattern exposed between the electrodes may be a sensor unit of a graphene sensor.

The portion of the graphene layer pattern exposed between the electrodes may be a channel of a graphene transistor.

According to an even further example embodiment, there is provided a graphene transferrer including a sacrificial layer over a substrate; a catalyst layer pattern, a graphene layer pattern and a metal thin-film layer pattern sequentially formed on the sacrificial layer. The catalyst layer pattern, the graphene layer pattern and the metal thin-film layer pattern have a same shape.

The catalyst layer pattern may have a thickness of about 100 nm to about 400 nm.

The sacrificial layer may have a thickness of about 100 nm to about 300 nm. The sacrificial layer includes one selected from silicon oxide and silicon nitride.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a graphene-transferring member in which metal thin films are formed on graphene, a graphene transferrer, a method of transferring graphene, and/or methods of fabricating graphene devices by using the same.

FIGS. 1A through 1H are cross-sectional views for explaining a method of graphene transferring by using a metal thin film according to an example embodiment.

Figure 1A:
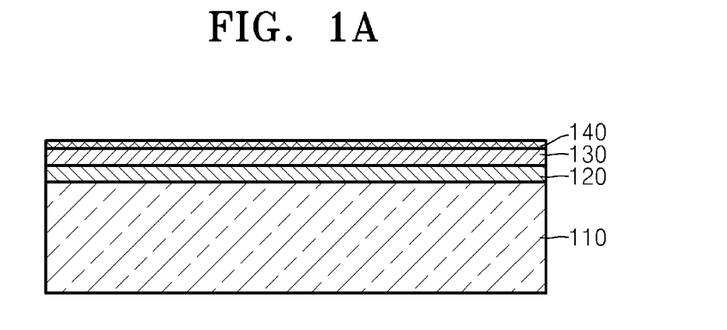
FIGS. 1A through 1H are cross-sectional views for explaining a method of graphene transferring by using a metal thin film according to an example embodiment.

Referring to FIG. 1A, an insulating layer 120 is formed on a substrate 110. Next, a catalyst layer 130 is coated on the insulating layer 120. Hereinafter, the insulating layer 120 may also be referred to as a sacrificial layer 120. The substrate 110 may be a silicon substrate. The sacrificial layer 120 may be formed of silicon oxide or silicon nitride to a thickness in a range of about 100 nm to about 300 nm.

The catalyst layer 130 may be formed on the sacrificial layer 120 by a plating, evaporation, or sputtering method using at least one metal selected from the group consisting of Ni, Fe, Co, Cu, Pt, Ru and a combination thereof. The catalyst layer 130 may be formed to a thickness in a range of about 100 nm to about 400 nm.

A graphene layer 140 is formed on the catalyst layer 130. The graphene layer 140 may be formed using a conventional method. For example, a source gas that contains carbon may be deposited on the catalyst layer 130 by using a chemical vapor deposition (CVD) method or a thermal decomposition method. The carbon-containing source gas may be one selected from the group consisting of $CH_4$, $C_2H_2$, $C_2H_4$, CO and a combination thereof. The graphene layer 140 may be formed as a single layer graphene or a bi-layer graphene to maintain inherent characteristics of graphene, and may be formed to a thickness in the range of about 0.3 nm to about 2 nm.

Figure 1B:
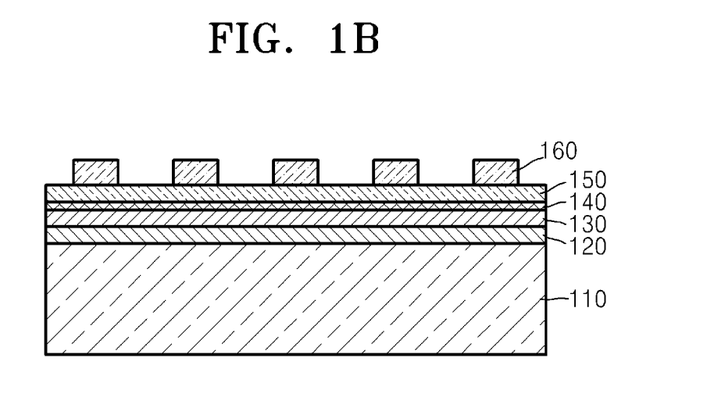

Referring to FIG. 1B, a metal thin-film layer 150 as a protective layer is formed on the graphene layer 140. The metal thin-film layer 150 may be formed by a conventional deposition process using a metal selected from the group consisting of Au, Cu, Ni, Ti, Fe, Ru, Pd and a combination thereof to a thickness in the range of about 10 nm to about 2 µm. The metal thin-film layer 150 may protect the graphene layer 140 in a patterning process and a graphene transferring process.

Next, a photoresist pattern 160 is formed on the metal thin-film layer 150 by a conventional method.

Figure 1C:
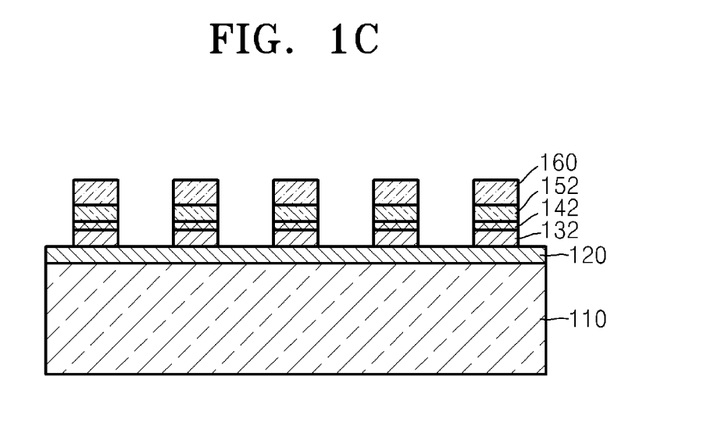

Referring to FIG. 1C, the metal thin-film layer 150, the graphene layer 140, and the catalyst layer 130 are patterned using the photoresist pattern 160 as a mask to form a metal thin-film layer pattern 152, a graphene layer pattern 142 and a catalyst layer pattern 132. The catalyst layer pattern 132, the graphene layer pattern 142 and the metal thin-film layer pattern 152 sequentially formed on the sacrificial layer over the substrate 110 may collectively form a graphene transferrer. The patterned layers (i.e., the metal thin-film layer pattern 152, the graphene layer pattern 142, and the catalyst layer pattern 132) may have the same shape.

Figure 1D:
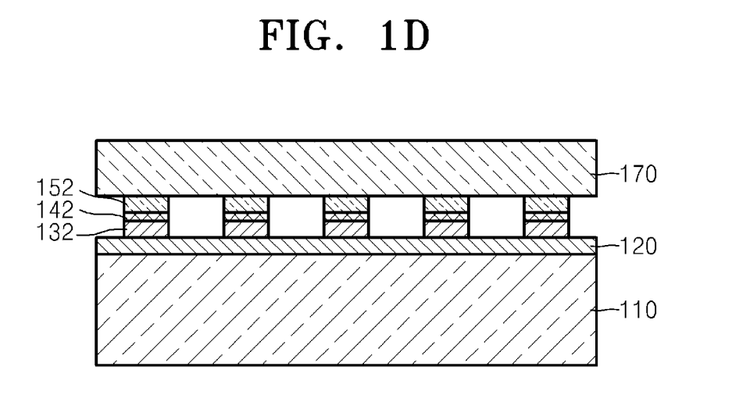

Referring to FIG. 1D, after removing the photoresist pattern 160, an adhesive layer 170 is formed on the metal thin-film layer 152. The adhesive layer 170 may be one of an adhesive tape, glue, an epoxy resin (e.g., polycarbonate), a thermal release tape, a water-soluble tape, and a photoresist or a mixture of these materials. The adhesive layer 170 may be formed to a thickness in the range of about 1 µm to about 200 µm. As described later, the adhesive layer 170 is used for supporting the metal thin-film layer 152 and the graphene layer 142 when the graphene layer 142 with the catalyst layer 132 thereon is removed from the substrate 110.

The metal thin-film layer 152 prevents the adhesive layer 170 from contacting the graphene layer 142. When the adhesive layer 170 is directly grown on the graphene layer 142 by not forming the metal thin-film layer 152 therebetween, the graphene layer 142 may be damaged in the course of removing the adhesive layer 170. However, in the current example embodiment, because the metal thin-film layer 152 is disposed between the adhesive layer 170 and the graphene layer 142, damage to the graphene layer 142 is prevented during the removal of the adhesive layer 170.

Figure 1E:
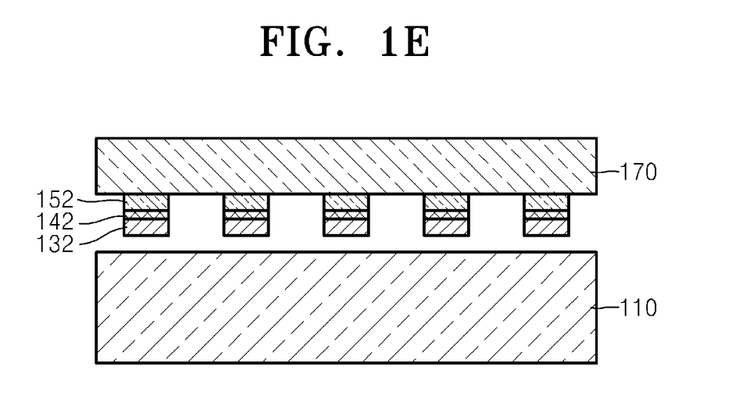

Referring to FIG. 1E, the sacrificial layer 120 between the substrate 110 and the catalyst layer 132 is removed by a wet etching. Accordingly, the catalyst layer 132 is separated from the substrate 110.

Figure 1F:
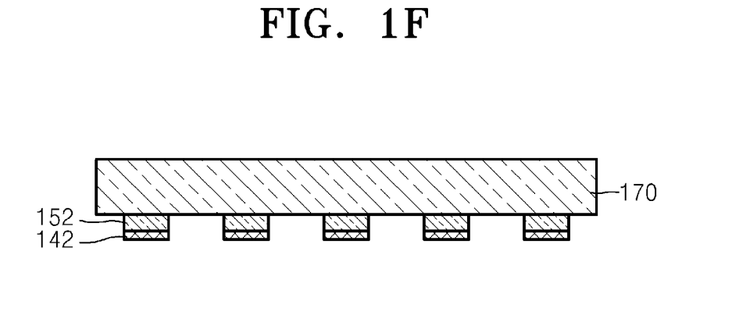

Referring to FIG. 1F, the catalyst layer 132 is removed using a galvanic corrosion effect or a wet etching method. The catalyst layer 132 and the metal thin-film layer 152 may be formed of different materials that form (or, promote) galvanic corrosion effects. That is, when the catalyst layer 132 and the metal thin-film layer 152 (which are formed of different materials) are soaked in an etching solution, a potential difference is present between the catalyst layer 132 and the metal thin-film layer 152. Accordingly, electrons in the catalyst layer 132 move to the metal thin-film layer 152, and thus, the corrosion rate of the catalyst layer 132 having an activated potential is increased and damage to the graphene layer 142 may be minimized (or, alternatively, prevented). In order to obtain the galvanic corrosion effect, the metal thin-film layer 152 may be formed of a metal selected from the group consisting of Au, Ru, Pd and a combination thereof, and the catalyst layer 132 may be formed of a metal selected from the group consisting of Ni, Fe, Co, Cu and a combination thereof.

Figure 1G:
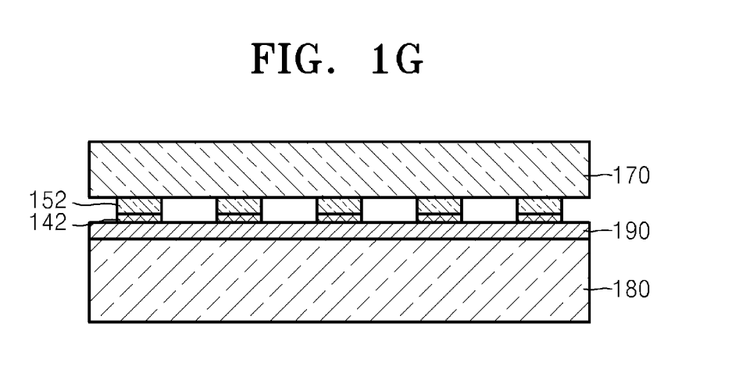

Referring to FIG. 1G, the graphene layer 142 is transferred to a transfer-target substrate 180. An insulating layer 190 may be formed on the transfer-target substrate 180, and the graphene layer 142 may be formed on the insulating layer 190.

Figure 1H:
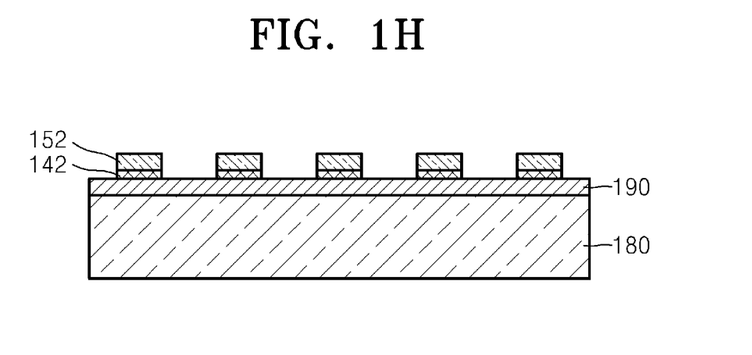

Referring to FIG. 1H, the adhesive layer 170 is removed. The adhesive layer 170 may be removed by wet or dry etching. In this process, the metal thin-film layer 152 formed on the graphene layer 142 may protect the graphene layer 142. The metal thin-film layer 152 may be used as a protective film configured for protecting the graphene layer 142 when a graphene device is fabricated, and may also be used as an electrode. As described below, a portion of the metal thin-film layer 152 may be removed in a process of fabricating a graphene device.

Figure 2:
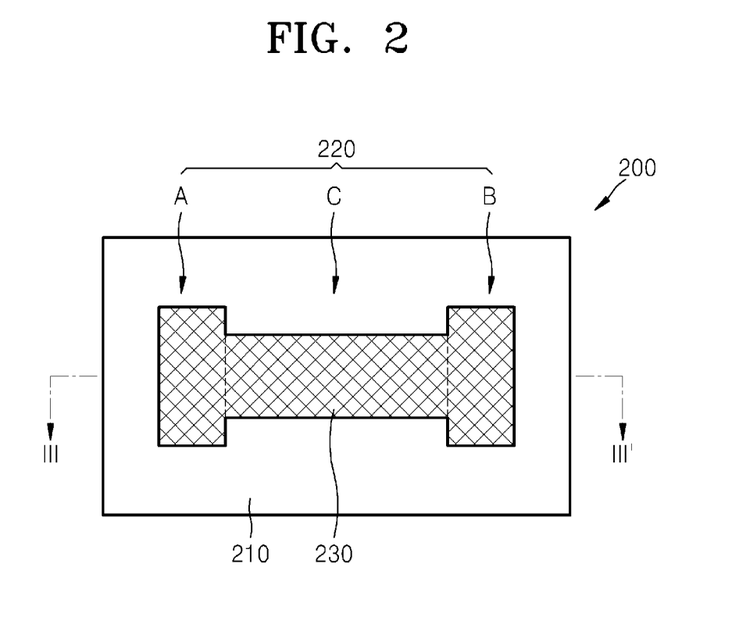
FIG. 2 is a plan view of a graphene transferring member having graphene for transferring, according to another example embodiment.
Figure 3:
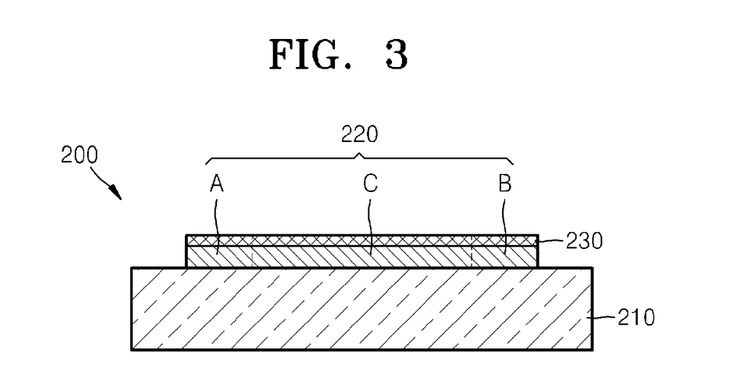
FIG. 3 is a cross-sectional view taken along line III-III' of FIG. 2.

FIG. 2 is a plan view of a graphene transferring member having graphene for transferring, according to another example embodiment. FIG. 3 is a cross-sectional view taken along line III-III' of FIG. 2.

Referring to FIGS. 2 and 3, a graphene transferring member 200 includes a metal thin-film layer 220 and a graphene layer 230 sequentially formed on an adhesive member 210. The metal thin-film layer 220 and the graphene layer 230 are patterned into the same shape by a pattern (not shown) formed above the graphene layer 230. The metal thin-film layer 220 includes electrode forming portions A and B, which are separated from each other, and a metal portion C between the electrode forming portions A and B. When the metal portion C is removed, the electrode forming portions A and B may become electrodes on the graphene layer 230.

The adhesive member 210 may be one of an adhesive tape, glue, an epoxy resin, polycarbonate, a thermal release tape, a water-soluble tape, and a photoresist, or a mixture of these materials. The adhesive member 210 may be formed to a thickness in a range of about 1 μm to about 200 μm. The adhesive member 210 supports the graphene layer 230 and the metal thin-film layer 220.

The metal thin-film layer 220 may be formed of a metal selected from the group consisting of Au, Cu, Ni, Ti, Fe, Ru, Pd and a combination thereof to a thickness in a range of about 10 nm to about 2 μm.

The graphene layer 230 may be a single layer graphene or a bi-layer graphene.

The graphene transferring member 200 may be the same resultant product shown in FIG. 1F in the fabrication method described above. In FIG. 1F, a plurality of patterns are formed, and in FIGS. 2 and 3, a single pattern is shown.

The graphene transferring member 200 according to the present example embodiment may be transferred onto a transfer-target substrate. Also, in a transfer process, the graphene layer 230 formed on the graphene transferring member 200 may be used as a protective film configured for protecting the metal thin-film layer 220. Also, the metal thin-film layer 220 may be utilized as an electrode connected to ends of the graphene layer 230.

Figure 4A:
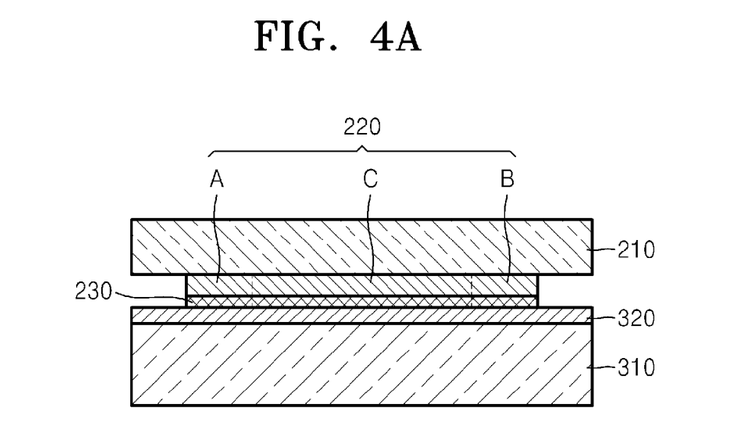
FIGS. 4A through 4C are cross-sectional views for explaining a method of fabricating a graphene sensor as a graphene device by using the graphene transferring member of FIGS. 2 and 3.
Figure 4B:
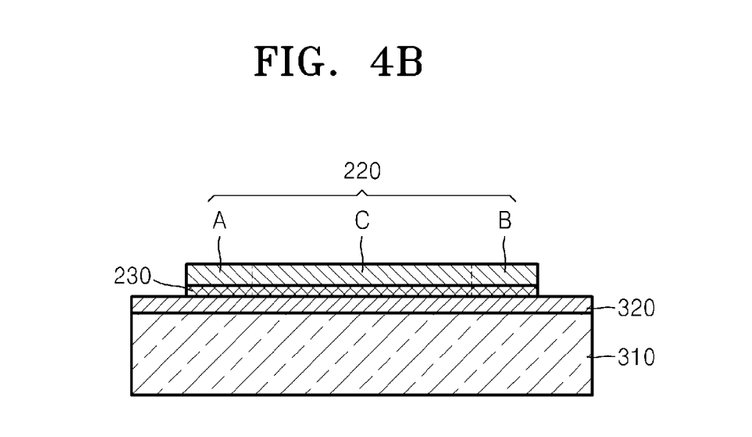
Figure 4C:
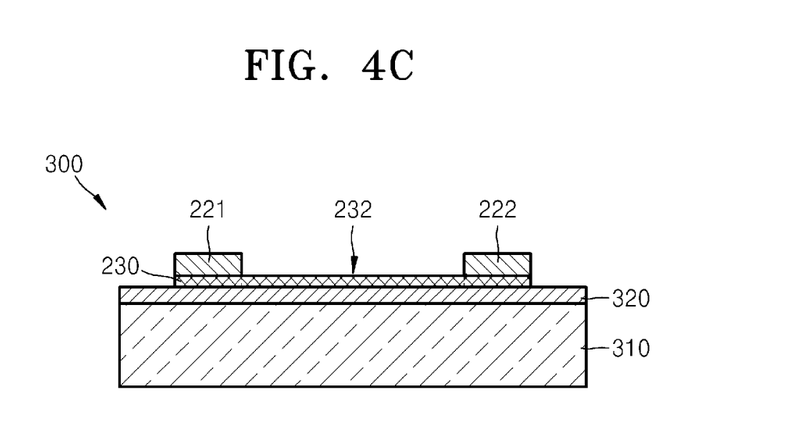

FIGS. 4A through 4C are cross-sectional views for explaining a method of fabricating a graphene sensor as a graphene device by using the graphene transferring member of FIGS. 2 and 3.

Like reference numerals are used for elements substantially identical to elements of FIGS. 2 and 3, and thus, detailed descriptions thereof will not be repeated.

Referring to FIG. 4A, the graphene layer 230 of the graphene transferring member 200 (shown in FIGS. 2 and 3) is transferred onto a transfer-target substrate 310. The graphene transferring member 200 may have the structure of FIGS. 2 and 3. An insulating layer 320 may be formed on the transfer-target substrate 310, and the graphene layer 230 of the graphene transferring member 200 may be transferred onto the insulating layer 320.

The metal thin-film layer 220 includes the metal portion C between the electrode forming portions A and B.

Referring to FIG. 4B, the adhesive member 210 is removed. The adhesive member 210 may be removed by a wet or dry etching method. In this process, the metal thin-film layer 220 formed on the graphene layer 230 may protect the graphene layer 230.

Referring to FIG. 4C, the graphene layer 230 between the electrode forming portions A and B is exposed by removing the metal portion C. The electrode forming portions A and B respectively are referred to as a first electrode 221 and a second electrode 222.

The resultant product of FIG. 4C may be a graphene sensor 300 (i.e., a sensor that uses graphene) having a sensing unit 232 formed of the graphene layer 230 between the first and second electrodes 221 and 222. When the sensing unit 232 adsorbs a specific material, an electrical characteristic variation of the sensing unit 232 occurs. Then, the graphene sensor 300 may measure the electrical characteristic variation from the first and second electrodes 221 and 222.

Figure 5A:
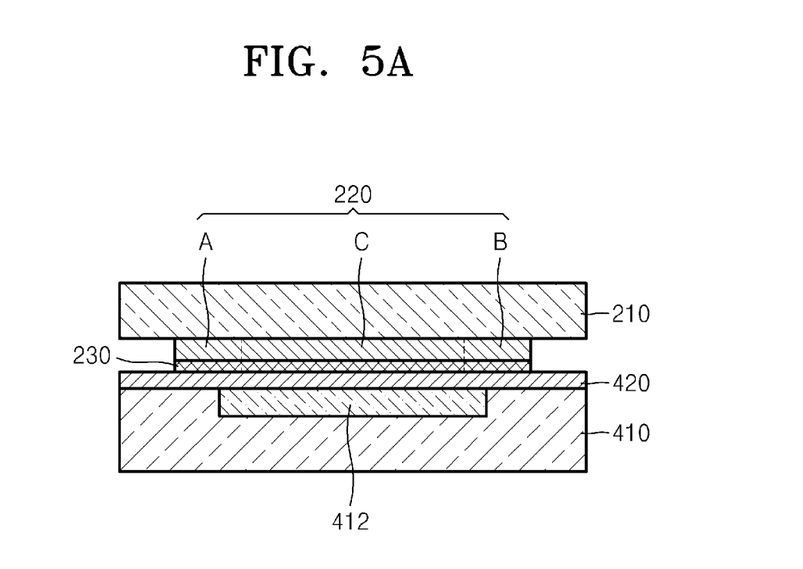
FIGS. 5A through 5C are cross-sectional views for explaining a method of fabricating a graphene transistor as a graphene device by using the graphene transferring member of FIGS. 2 and 3.
Figure 5B:
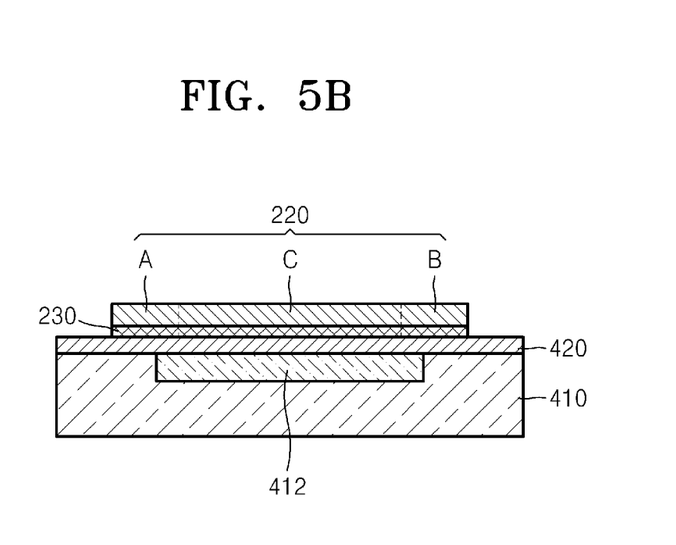
Figure 5C:
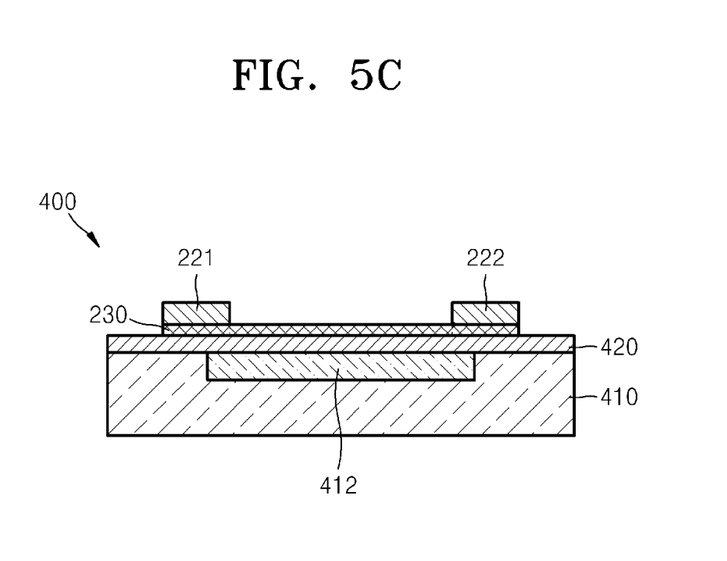

FIGS. 5A through 5C are cross-sectional views for explaining a method of fabricating a graphene transistor as a graphene device by using the graphene transferring member of FIGS. 2 and 3.

Like reference numerals are used to elements substantially identical to elements of FIGS. 2 and 3, and thus, detailed descriptions thereof will not be repeated.

Referring to FIG. 5A, the graphene layer 230 of the graphene transferring member 200 is transferred onto a transfer-target substrate 410. The graphene transferring member 200 may have the same structure as shown in FIGS. 2 and 3. An insulating layer 420 may be formed on the transfer-target substrate 410, and the graphene layer 230 may be transferred onto the insulating layer 420. A gate electrode 412 is formed on (or, alternatively, recessed within) the transfer-target substrate 410 in advance, and the insulating layer 420 on the gate electrode 412 is a gate oxide. If the transfer-target substrate 410 is a conductive substrate, the transfer-target substrate 410 may be a back gate without the formation of the gate electrode 412.

The metal thin-film layer 220 includes a metal portion C between the electrode forming portions A and B.

Referring to FIG. 5B, the adhesive member 210 is removed. The adhesive member 210 may be removed by a wet or dry etching method. In this process, the metal thin-film layer 220 formed on the graphene layer 230 may protect the graphene layer 230.

Referring to FIG. 5C, the graphene layer 230 between the electrode forming portions A and B is exposed by removing the metal portion C. The electrode forming portions A and B respectively are referred to as a first electrode 221 and a second electrode 222. The exposed portion of the graphene layer 230 functions as a channel between the first and second electrodes 221 and 222.

The resultant product of FIG. 5C may be a graphene transistor 400 (i.e., a transistor including a channel formed of graphene between the first and second electrodes 221 and 222). The channel may be formed to have a width of 20 nm or less, and the graphene transistor 400 may be a field effect transistor. However, when the channel width of the graphene transistor 400 is increased, the graphene transistor 400 may be used as an RF transistor.

In the above example embodiment, a method of fabricating a back gate transistor has been described. However, the current example embodiment is not limited thereto. For example, a top gate transistor, in which a gate oxide and a gate electrode are further formed on the exposed channel instead of the back gate, may also be fabricated.

In the graphene transferring member according to example embodiments, a transferring process may be performed by using a metal thin-film as a protective film of the graphene layer, and then the metal thin-film may be used as electrodes.

In the graphene transferring method according to example embodiments, graphene may be protected by a metal thin-film layer in a transferring process by forming the metal thin-film layer on a graphene layer.

In the method of fabricating a graphene device according to example embodiments, graphene may be protected by a metal thin-film in a graphene transferring process and a graphene fabricating process using the graphene transferring member described above. Also, a portion of the metal thin-film that remains after removing a portion of the metal thin-film may be used as an electrode, and the exposed graphene may be used as a constituent (e.g., a channel) of a graphene device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of transferring graphene, the method comprising:
    sequentially forming a sacrificial layer and a catalyst layer on a substrate;
    growing a graphene layer on the catalyst layer;
    forming a metal thin-film layer on the graphene layer;
    patterning the metal thin-film layer, the graphene layer, and the catalyst layer to form the metal thin-film layer pattern, a graphene layer pattern and a catalyst layer pattern;
    forming an adhesive layer on the metal thin-film layer;
    sequentially removing the sacrificial layer and the catalyst layer pattern; and
    transferring the graphene layer pattern from the adhesive layer onto a transfer-target substrate so that the graphene layer pattern contacts the transfer-target substrate.

2. The method of claim 1, wherein the adhesive layer is one selected from an adhesive tape, glue, polycarbonate, an epoxy resin, a thermal release tape, a water-soluble tape, and a photoresist.

3. The method of claim 1, wherein the graphene layer is a single layer graphene or a bi-layer graphene.

4. The method of claim 1, wherein the metal thin-film layer and the graphene layer are patterned into a same shape.

5. The method of claim 1, wherein the catalyst layer is formed of a metal selected from nickel (Ni), iron (Fe), cobalt (Co), copper (Cu), platinum (Pt), ruthenium (Ru) and a combination thereof.

6. The method of claim 1, wherein the metal thin-film layer is formed of a metal selected from Au, Cu, Ni, Ti, Fe, Ru, Pd and a combination thereof.

7. The method of claim 1, wherein the removing the catalyst layer pattern includes using a galvanic corrosion effect.

8. A method of fabricating a graphene device, the method comprising:
    sequentially forming a sacrificial layer and a catalyst layer on a substrate;
    growing a graphene layer on the catalyst layer;
    forming a metal thin-film layer on the graphene layer;
    patterning the metal thin-film layer, the graphene layer, and the catalyst layer to form the metal thin-film layer pattern, a graphene layer pattern and a catalyst layer pattern;
    forming an adhesive layer on the metal thin-film layer pattern;
    sequentially removing the sacrificial layer and the catalyst layer pattern;
    transferring the graphene layer pattern and the metal thin-film pattern from the adhesive layer onto a transfer-target substrate so that the graphene layer pattern contacts the transfer-target substrate;
    removing the adhesive layer; and
    patterning the metal thin-film layer pattern to form electrodes at respective ends of the graphene layer pattern, a portion of the graphene layer pattern between the electrodes being exposed.

9. The method of claim 8, wherein the adhesive layer is one selected from an adhesive tape, glue, polycarbonate, an epoxy resin, a thermal release tape, a water-soluble tape, and a photoresist.

10. The method of claim 8, wherein the graphene layer is a single layer graphene or a bi-layer graphene.

11. The method of claim 8, wherein the metal thin-film layer pattern and the graphene layer pattern have a same shape.

12. The method of claim 8, wherein the catalyst layer is formed of a metal selected from Ni, Fe, Co, Cu, Pt, Ru and a combination thereof.

13. The method of claim 8, wherein the metal thin-film layer is formed of a metal selected from Au, Cu, Ni, Ti, Fe, Ru, Pd and a combination thereof.

14. The method of claim 8, wherein the removing the catalyst layer includes using a galvanic corrosion effect.

15. The method of claim 8, wherein the portion of the graphene layer pattern exposed between the electrodes is a sensor unit of a graphene sensor.

16. The method of claim 8, wherein the portion of the graphene layer pattern exposed between the electrodes is a channel of a graphene transistor.

* * * * *